(12) United States Patent
Wieduwilt et al.

(10) Patent No.: US 11,710,514 B2
(45) Date of Patent: Jul. 25, 2023

(54) DELAY OF SELF-REFRESHING AT MEMORY DIE

(71) Applicant: Micron Technology, Inc., Boise, ID (US)

(72) Inventors: Christopher D. Wieduwilt, Boise, ID (US); Lawrence D. Smith, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/493,501

(22) Filed: Oct. 4, 2021

(65) Prior Publication Data

US 2023/0104646 A1 Apr. 6, 2023

(51) Int. Cl.
*G11C 11/406* (2006.01)
*G11C 17/16* (2006.01)
*G11C 11/4076* (2006.01)

(52) U.S. Cl.
CPC .... *G11C 11/40622* (2013.01); *G11C 11/4076* (2013.01); *G11C 11/40615* (2013.01); *G11C 17/16* (2013.01)

(58) Field of Classification Search
CPC ........ G11C 11/40622; G11C 11/40615; G11C 11/4076; G11C 17/16
See application file for complete search history.

(56) References Cited

U.S. PATENT DOCUMENTS

| | | | |
|---|---|---|---|
| 7,466,577 B2 * | 12/2008 | Sekiguchi | G11C 5/04 257/777 |
| 8,161,356 B2 | 4/2012 | Bains et al. | |
| 8,559,258 B1 * | 10/2013 | Stephens, Jr. | G11C 29/50016 365/222 |
| 8,958,259 B2 * | 2/2015 | Sakakibara | G11C 11/40618 365/222 |
| 9,230,610 B2 * | 1/2016 | Woo | G11C 5/025 |
| 9,570,142 B2 | 2/2017 | Shido | |
| 9,754,655 B2 | 9/2017 | Saifuddin et al. | |
| 10,020,046 B1 * | 7/2018 | Uemura | G11C 11/4087 |
| 10,424,363 B2 | 9/2019 | Uemura | |
| 11,398,258 B2 * | 7/2022 | Fisch | H01L 27/10897 |
| 2016/0350002 A1 | 12/2016 | Vergis et al. | |

(Continued)

OTHER PUBLICATIONS

"Micron DDR5: Key Module Features", Micron Technical Brief, 2020, pp. 1-7, retrieved from https://media-www.micron.com/-/media/client/global/documents/products/technical-marketing-brief/ddr5_key_module_features_tech_brief.pdf?la-en-in&rev=f3ca96bed7d9427ba72b4c192dfacb56.

*Primary Examiner* — Son L Mai

(74) *Attorney, Agent, or Firm* — Brooks, Cameron & Huebsch, PLLC

(57) ABSTRACT

First signaling indicative of instructions to enter a self-refresh (SREF) mode can be received concurrently by a plurality of memory dies. Responsive to a memory die of the plurality of memory dies entering the SREF mode, self-refreshing of memory banks of the memory die can be delayed, at the memory die and based on fuse states of an array of fuses of the memory die, an amount of time relative to receipt of the signaling by the memory die. Delaying self-refreshing of memory banks of memory dies in a staggered, or asynchronous, manner can evenly distribute power consumption of the memory dies so that the likelihood of an associated power spike is reduced or eliminated.

16 Claims, 7 Drawing Sheets

(56) References Cited

U.S. PATENT DOCUMENTS

| | | |
|---|---|---|
| 2018/0096719 A1* | 4/2018 | Tomishima ............ G11C 29/48 |
| 2020/0176047 A1 | 6/2020 | Meier et al. |
| 2020/0219555 A1 | 7/2020 | Rehmeyer |
| 2020/0388324 A1 | 12/2020 | Rehmeyer et al. |
| 2021/0005244 A1 | 1/2021 | Hisock et al. |

* cited by examiner

DELAY OF SELF-REFRESHING AT MEMORY DIE

TECHNICAL FIELD

The present disclosure relates generally to memory devices, and more particularly, to apparatuses and methods related to delaying, at a memory die, self-refreshing of the memory die.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
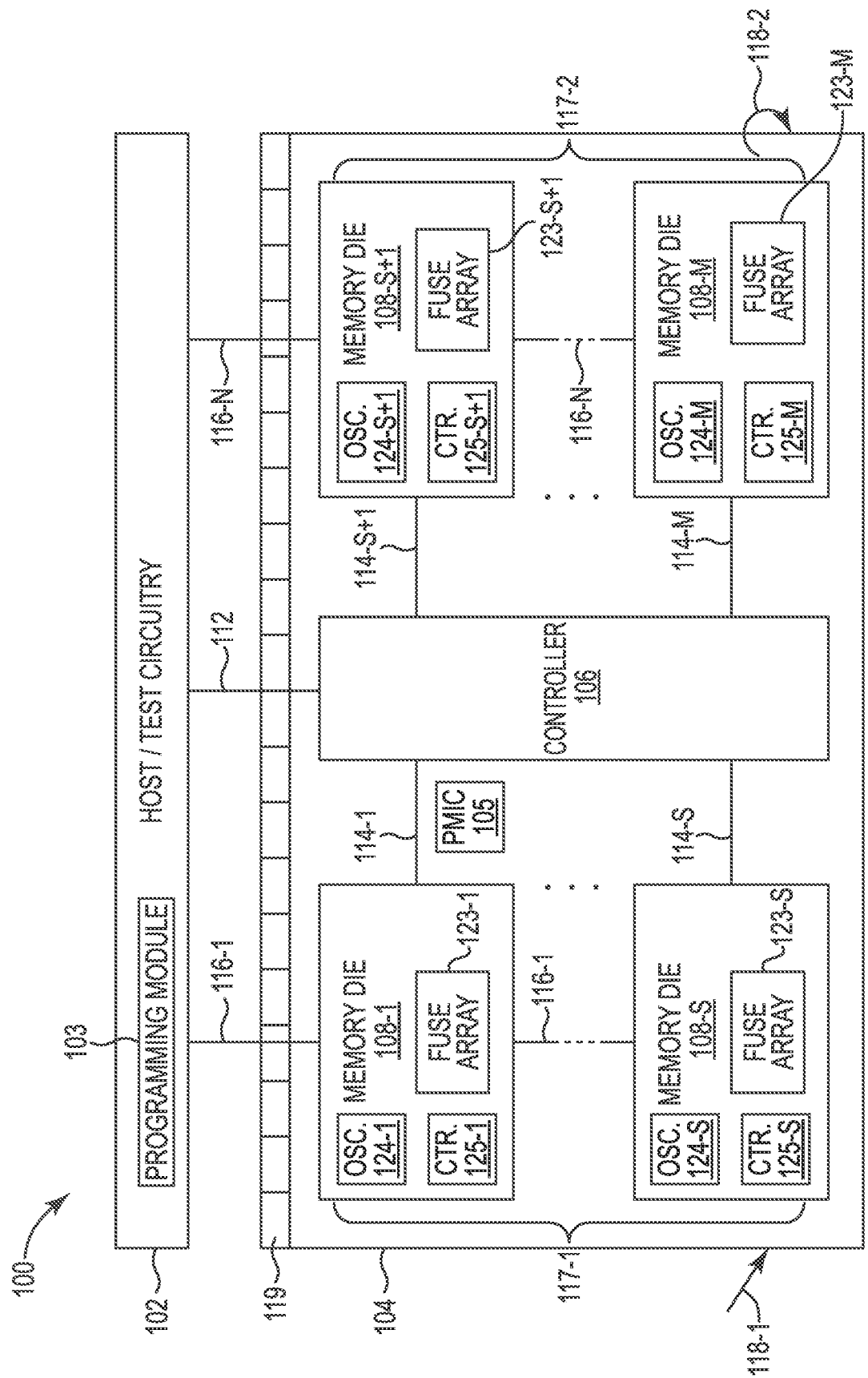
FIG. 1 is a block diagram of an apparatus in the form of a computing system including a memory sub-system including memory dies in accordance with a number of embodiments of the present disclosure.

The present disclosure includes apparatuses and methods related to delaying, at a memory die, self-refreshing of the memory die. Memory dies of a memory device can be put into a self-refresh (SREF) mode by receiving a command to enter the SREF mode from a controller and/or host. Self-refreshing of memory banks of a memory die can include performing refresh operations (e.g., internal refresh operations) on the memory banks without further instruction from a source external to the memory device except for a command to exit the SREF mode. As used herein, an "internal refresh operation" refers to a refresh operation performed on memory banks of a memory die that is wholly performed and controlled by components and/or circuitry of the memory die. As described herein, delaying, at a memory die of a memory device, self-refresh of memory cells of that memory die can include modifying a timing of refresh operations as compared to a default timing of refresh operations associated with self-refreshing memory cells of a memory die of a different memory device. For instance, signaling indicative of a refresh operation (e.g., an internal refresh operation) to be performed on memory banks of a memory die can be delayed by components and/or circuitry of the memory die.

A memory device, such as a memory sub-system, can include multiple memory dies. When a memory device is in a self-refresh (SREF) mode, multiple memory dies may commence self-refreshing concurrently. As used herein, "concurrently" refers to performing an operation by two or more components at approximately or nearly the same time and does not require the components to commence and/or cease performance of the operation at the same time. In some examples, "concurrently" refers to operations performed within a common time period or number of clock cycles defined by an industry standard, specification, datasheet, or the like. Once a memory device enters a self-refresh (SREF) mode, each memory die is individually and independently responsible for performing a self-refresh operation. The memory dies can include internal refresh paths that are not shared by other memory dies of the memory device. The internal refresh paths can be used to adjust a timing of refresh operations for respective memory dies of the memory device.

In some previous approaches, in response to a memory device entering a SREF mode, multiple memory dies of the memory device may enter the SREF mode concurrently and may perform refresh operations on memory banks of the respective memory dies concurrently. Performing refresh operations for multiple memory dies of a memory device concurrently may cause the memory device to experience a spike in power consumption (hereinafter referred to as a power spike). A power spike may strain a power delivery network of a memory device. As used herein, "power delivery network" refers to one or more components of a memory device via which power is provided to memory dies of the memory device. A power spike may strain a power delivery network in its ability to provide power to meet the power needs of the memory dies during the spike in power consumption. A power spike may cause interference with memory cells of a memory die and/or memory cells of neighboring memory dies. As used herein, "neighboring memory dies" refers to memory dies that are in close, physical proximity to one another. For example, neighboring memory dies can be memory dies that are physically adjacent to one another. Neighboring memory dies can be memory dies of a rank of the memory device that are physically adjacent to a different rank of memory dies of the memory device. As used herein, "rank" of a memory device refers to a set of memory dies that are coupled to a same chip select such that the memory dies are accessed concurrently and share a command/address pin of the memory device. Neighboring memory dies can be memory dies of a channel of a memory device that are physically adjacent to memory dies of a different channel of the memory sub-system. As used herein, "channel" of a memory device refers to a set of memory dies that share an input/output (I/O) pin of the memory device.

Embodiments of the present disclosure address the above deficiencies and other deficiencies of previous approaches by performing respective refresh operations associated with self-refreshing memory dies of a memory sub-system asynchronously. Rather than performing refresh operations for the memory dies concurrently, a delay can be introduced in timing of performing the respective refresh operations so that the refresh operations are performed in a staggered or asynchronous manner. Embodiments of the present disclosure can reduce, or eliminate, power spikes (e.g., instantaneous power spikes), which can reduce interference between memory cells of different (e.g., neighboring) memory dies. Embodiments of the present disclosure can reduce, or eliminate, droop of a supply voltage (e.g., VDD) provided to memory dies of a memory device by a power management integrated circuit (PMIC), for example. Because the refresh operations are performed asynchronously, a resulting instantaneous current draw has a lesser amplitude than previous approaches. Embodiments of the present disclosure can improve an efficiency of refreshing the memory dies. For instance, system power management can include an on-die and/or on-module power delivery network.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. Analogous elements within a figure may be referenced with a hyphen and extra numeral or letter. See, for example, elements 123-1, . . . , 123-S in FIG. 1. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a computing system 100 including a memory sub-system 104 including memory dies 108-1, . . . , 108-S and 108-S+1, . . . , 108-M in accordance with a number of embodiments of the present disclosure. The memory devices 108-1, . . . , 108-S and 108-S+1, . . . , 108-M are collectively referred to as the memory dies 108. Each of the memory dies 108 can be referred to as a chip. As used herein, the computing system 100, a host 102, the memory sub-system 104, and/or the memory dies 108, for example, might also be separately considered to be an "apparatus."

As illustrated by FIG. 1, the computing system 100 can include the host 102 coupled to the memory sub-system 104 via an interface. The interface can communicate control signals, address signals, data, and/or other signals between the memory sub-system 104 and the host 102. The interface can include a command/address bus 112 and data buses 116-1, . . . , 116-N (collectively referred to as the data buses 116) that couples the memory system 104 to the host 102 via one or more pins 119. The memory dies 108-1, . . . , 108-S can be coupled to the data bus 116-1. The memory dies 108-S+1, . . . , 108-M can be coupled to the data bus 116-N. The data buses 116 can provide data for read/write operations between the host 102 and the memory sub-system 104. In some embodiments, the command/address bus 112 can include separate command and address buses. In some embodiments, the command/address bus 112 and the data buses 116 can be part of a common bus. The command/address bus 112 can communicate signals from the host 102 to a controller 106 of the memory sub-system 104 such as clock signals for timing, reset signals, chip selects, addresses for the memory dies 108, parity information, etc. The command/address bus 112 can be used by the controller 106 to send alert signals to the host 102. The command/address bus 112 can be operated according to a protocol. The interface can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some embodiments, the controller 106 is a serial presence detect (SPD) hub or simply "hub," which may include a temperature sensor, clock functionality, isolation circuitry (e.g., an ability to isolate a bus on the module, such as a bus or buses 114-1, . . . , 114-S and 114-2, . . . , 114-M (collectively referred to as the buses 114) from other buses or from the host 102, such as via the command/address bus 112 and/or the data buses 116). In some embodiments, the controller 106 is a register clock driver (RCD), such as RCD employed on an RDIMM or LRDIMM.

The memory sub-system 104 can include a PMIC 105. The PMIC 105 can be configured to output one or more voltages for various operations performed by the memory sub-system 104. The voltages to be output by the PMIC 105 can be determined based on conversion of the PMIC supply voltage to one or more reduced voltages corresponding to voltages compatible with operation of one or more components of the memory sub-system 104, such as the controller 106, memory components such as the memory dies 108, and/or circuitry associated therewith, such as control circuitry, input/output (I/O) circuitry, address circuitry, etc. The PMIC 105 can provide voltage levels for respective refresh operations performed by the memory dies 108. Connections between the memory dies 108 and the PMIC 105 are not illustrated by FIG. 1 for clarity. Although FIG. 1 illustrates the PMIC 105 on the same side of the memory sub-system 104 as the controller 106, embodiments of the present disclosure are not so limited. For example, the PMIC 105 can be on a opposite side of the memory sub-system 104 than the controller 106.

The pins 119 can be components of the memory sub-system 104. The memory system 104 can receive signaling indicative of commands from the host 102 via the pins 119. For example, the memory system 104 can receive, via the data buses 112 and/or the buses 116, control signals, address signals, data, and/or other signals via the pins 119. The pins 119 can physically couple the memory system 104 to the computing system 100. The pins 119 provides an interface for communication between the memory sub-system 104 and the computing system 100. The pins 119 can comprises one or more metal materials, such as copper, nickel, and/or gold, among other metal materials. The pins 119 can include top pins (as shown) and bottom pins (not shown). The top pins and the bottom pins can include pins formed on either side of a circuit board and are not intended to limit the orientation of the pins on the memory sub-system 104.

The computing system 100 can be a personal laptop computer, a desktop computer, a digital camera, a mobile telephone, a memory card reader, or an Internet-of-Things (IoT) enabled device, among various other types of systems. For clarity, the computing system 100 has been simplified to focus on features with particular relevance to the present disclosure. The host 102 can include a number of processing resources (e.g., one or more processors, microprocessors, or some other type of controlling circuitry) capable of accessing the memory sub-system 104.

The memory sub-system 104 can provide main memory for the computing system 100 or could be used as additional memory or storage for the computing system 100. By way of example, the memory sub-system 104 can be a dual in-line memory module (DIMM) including the memory dies 108 operated as double data rate (DDR) DRAM, such as DDR5, a graphics DDR DRAM, such as GDDR6, or another type of memory system. Embodiments of the present disclosure are not limited to a particular type of memory of the memory sub-system 104. Non-limiting examples of types of the memory dies 108 include RAM, ROM, SDRAM, PCRAM, RRAM, flash memory, and three-dimensional cross-point, among others. In some embodiments, the memory sub-system 104 can include multiple different types of memory.

A three-dimensional (3-D) cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. A 3-D cross-point array can include resistive, phase-change, or similar memory cells. A storage material of the memory cells can be a chalcogenide material, for example, in a cross-point configuration between a word line and a bit line and can be in series with a select device and/or select device material.

The controller 106 can be coupled to the memory dies 108 via respective buses 114-1, . . . , 114-S and 114-2, . . . , 114-M. The buses 114 can be referred to as internal command/address buses 114 (e.g., internal to the memory sub-system 104) in contrast to the command/address bus 112 that couples the memory sub-system 104 to the external host 102. The buses 114-1, . . . , 114-S can be a shared command bus and the buses 114-2, . . . , 114-M can be another shared command bus. The memory dies 108 can be addressed individually and independently via the buses 114. A subset of the memory dies 108, such as a rank or channel of the memory sub-system 104, can be addressed independently via the buses 114.

The controller 106 can be implemented as hardware, firmware, and/or software. For example, the controller 106 can be an application specific integrated circuit (ASIC) coupled to a printed circuit board including a physical interface. The controller 106 can thereby relay command and/or address signals from the host 102 via the command/address bus 112 to the memory dies 108. In some embodiments, the controller 106 can perform command and/or address translation of command and/or address signals from the host 102 prior to communicating the same to the memory dies 108. The controller 106 can operate the buses 114 with a same or different protocol than that with which the command/address bus 112 is operated. The controller 106 command and/or address signals, clock signals, select signals, and other related signals to the memory dies 108 via the buses 114. The memory dies 108 can communicate error signals, reset signals, and other related signals to the controller 106 via the buses 114. The controller 106 can provide the host 102 with access to the memory dies 108. Non-limiting examples of the commands for the memory dies 108 include read, write, and erase commands for data stored on the memory dies 108. The memory sub-system 104 can include the controller 106 and the memory dies 108 on separate integrated circuits or a same integrated circuit.

As illustrated by FIG. 1, each of the memory dies 108 can include a respective array of fuses (hereinafter "fuse arrays") 123-1, . . . , 123-S and 123-S+1, . . . , 123-M. The fuse arrays 123-1, . . . , 123-S and 123-S+1, . . . , 123-M can be referred to collectively as the fuse arrays 123. As used herein, "fuse array" refers to an array of programmable elements. The programmable elements of a fuse array can include fuses. As used herein, the term "fuse" includes both fuses and antifuses. A fuse is conductive in an initial state and, when programmed (e.g., by being subjected to excessive current), makes a transition to an insulated state (e.g., the electrically conductive path breaks or is "blown"). An antifuse is insulated in an initial state and, when programmed (e.g., by being subjected to dielectric breakdown), makes a transition to a conductive state. After transition, a fuse or antifuse cannot return to its initial state and is referred to as being one-time-programmable. In some embodiments, the fuse can be a gate oxide fuse, which can be one-time-programmable by breaking a gate oxide in a metal oxide semiconductor device. Other examples of fuses include one resistor—one transistor cells and one resistor—one diode cells, among others.

Each of the fuse arrays 123 is a collection of addressable fuses located somewhere on a memory die (e.g., the memory die 108-1). In some embodiments, there is only one fuse array 123 per memory die. The fuse arrays 123 can store manufacturing settings (e.g., repair addresses, voltage trims, timing trims, die identification, die config settings, speed settings, functions, etc.). The host 102 can comprise a programming module 103, which can be used to, for example, program (e.g., trim) the fuse arrays 123. The fuse arrays 123 can be programmed by a manufacturer of the memory sub-system 104 prior to a deployment and/or a sale of the memory sub-system 104 and/or the computing system 100, for example. On powerup or reset, the fuses are sensed with fuse logic circuitry (not specifically illustrated) one set at a time and broadcast on fuse bus routes (not specifically illustrated) around the die. The fuse states are then latched locally on the memory die 108. The fuse arrays 123 can be physically separate from circuitry (not shown) in which the fuse states are latched. The circuitry can include fuse latches. The fuse latches can be latches (e.g., flip flops) that store the fuse states near other circuitry that the fuse states are used to adjust. According to at least one embodiment of the present disclosure, the fuse latches can enable/disable a delay in a refresh path based on the latched states from the fuse arrays 123.

The controller 106 can be configured to distribute commands to the memory dies 108. Example command types include die-specific commands and all-die commands. An all-die command is a command that is intended to be executed by all the memory dies 108 of the memory sub-system 104. In contrast, a command that is intended to be executed by a subset (one or more but not all) of the memory dies 108 can have a die select signal associated therewith. Commands can be received via the command/address bus 112 from a host 102 or can be generated by the controller 106. Typically, execution of an all-die command, such as a command associated with self-refreshing of the memory dies 108 (e.g., a SREF command), occurs simultaneously such that performance of operations by the memory dies 108 in association with execution of the all-die command occurs at least partially concurrently. However, according to at least one embodiment of the present disclosure, each of the fuse arrays 123 can be programmed with a different respective delay state for each respective refresh path of the memory dies 108. The fuse latches can latch the different respective delay state from the respective fuse array 123 to delay signaling associated with refresh operations to memory banks of the memory dies 108. The delay state for a refresh path can correspond to a particular amount of time in which delay signaling associated with refresh operations is provided to memory banks of a memory die. As used herein, "particular" refers to a specific value. For instance, a fuse array of a memory die can be programmed to cause a delay in providing signaling associated with refresh operations to memory banks by a particular amount time.

As illustrated by FIG. 1, each of the memory dies 108 can include a respective oscillator 124-1, . . . , 124-S and 124-S+1, . . . , 124-M, which can be referred to collectively as the oscillators 124. The oscillators 124 can be used for timing of providing signaling for performing respective refresh operations (e.g., respective internal refresh operations) for the memory dies 108. As illustrated by FIG. 1, each of the memory dies 108 can include a respective counter 125-1, . . . , 125-S and 125-S+1, . . . , 125-M, which can be referred to collectively as the counters 125. Each respective one of the counters 125 coupled to a corresponding one of the oscillators 124.

In some previous approaches, the memory dies may include oscillators and counters for timing of internal refresh operations. However, the oscillators may operate at same frequency such that the counters of the respective memory dies may reach a same quantity of oscillations concurrently. Thus, the internal refresh operations are performed concurrently.

In some embodiments of the present disclosure, during respective refresh operations, each respective one of the memory devices 108 can provide respective signaling associated with the refresh operations to memory banks of the memory die in response to respective one the counters 125 indicating a same quantity of oscillations. However, in contrast to previous approaches, the memory devices 108 can include the fuse arrays 123 programmed with fuse states that, when latched, cause a delay on a conductive path (e.g., a refresh path) via which respective signaling associated with a refresh operation is provided to memory banks of a memory die.

In some embodiments, during respective refresh operations, the memory dies 108 can provide signaling associated with a refresh operation to the memory banks in response to the respective counters 125 indicating a different, respective quantity of oscillations of the oscillators 124. The respective quantities of oscillations for each of the memory dies 108 can be programmed via fuse states of the fuse arrays 123. The different respective quantities of oscillations cause the respective signaling to be provided to memory banks of the memory dies 108 in a staggered manner such that the refresh operations for the respective memory dies are performed asynchronously. The different quantities of oscillations can be multiples of a quantity of oscillations (e.g., multiples of 5).

In some embodiments, during respective refresh operations, one or more of the memory dies 108 can provide respective signaling associated with the refresh operations to memory banks of the memory dies in response to a first counter (e.g., a corresponding one of the counters 125) indicating a first quantity of oscillations of a corresponding one of the oscillators 124 and a second counter (not shown) indicating a second, respective quantity of oscillations of the corresponding one of the oscillators 124 directly subsequent to the first quantity of oscillations. Thus, each respective one of the memory dies 108 does not provide respective signaling associated with a refresh operation until the respective second counter indicates the respective second quantity of oscillations. The respective quantities of oscillations for each counter of each of the memory dies 108 can be programmed via fuse states of the fuse arrays 123. The second quantity of iterations can be different for each respective one of the memory dies 108, thereby staggering the respective refresh operations. The respective second quantity of oscillations can be a multiple of a quantity of oscillations.

Memory dies of a memory device can be organized into one or more ranks and/or one or more channels. As illustrated by FIG. 1, the memory dies 108 of the memory sub-system 104 are organized into two ranks 117-1 and 117-2. The ranks 117-1 and 117-2 can be referred to collectively as the ranks 117. The rank 117-1 includes the memory dies 108-1, . . . , 108-S and the rank 117-2 includes the memory dies 108-2, . . . , 108-M. The memory dies of a rank can share a command path from a controller to the memory dies of that rank. Thus, the memory dies 108-1, . . . , 108-S of the rank 117-1 can share a command path from the controller 106 and the memory dies 108-2, . . . , 108-M of the rank 117-2 can share a different command path from the controller 106. However, memory dies of a rank can be individually addressed via a shared command path.

The memory dies 108 of the memory sub-system 104 are organized into two channels 118-1 and 118-2. The channel 118-1 includes the ranks 117-1 and 117-2 and the memory dies associated therewith. Although not fully illustrated by FIG. 1, the channel 118-2 includes the ranks of memory sub-system 104 physically located on the opposite side of the memory sub-system 108 from the channel 118-1.

Figure 2:
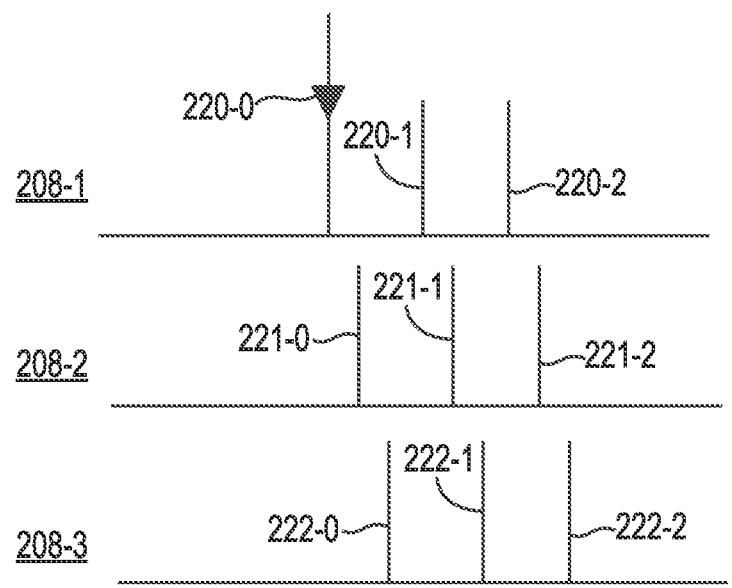
FIG. 2 is a timing diagram showing delaying, at memory dies of a memory sub-system, signaling associated with self-refreshing of memory banks of the memory dies in accordance with a number of embodiments of the present disclosure.

FIG. 2 is a representation of delaying, at memory dies 208-1, 208-2, and 208-3 of a memory sub-system, signaling 220-0, 220-1, 220-2, 221-0, 221-1, 221-2, 222-0, 222-1, and 222-2 associated with self-refreshing of memory banks of the memory dies 208-1, 208-2, and 208-3 in accordance with a number of embodiments of the present disclosure. The signaling 220-0, 220-1, and 220-2 is provided to memory banks of the memory die 208-1 as part of an internal refresh operation of the memory die 208-1. The signaling 221-0, 221-1, and 221-2 is provided to memory banks of the memory die 208-2 as part of an internal refresh operation of the memory die 208-2. The signaling 222-0, 222-1, and 222-2 is provided to memory banks of the memory die 208-3 as part of an internal refresh operation of the memory die 208-3. The memory dies 208-1, 208-2, and 208-3 can be analogous to the memory dies 108-1, 108-2 (not shown), and 108-3 (not shown) described in association with FIG. 1.

The horizontal axes illustrated by FIG. 2 represent the flow of time from left to right. As illustrated by FIG. 2, the signaling 220-0, 220-1, 220-2, 221-0, 221-1, 221-2, 222-0, 222-1, and 222-2 is not provided to memory banks of the memory dies 208-1, 208-2, and 208-3 concurrently. Rather, the signaling 220-0, 220-1, 220-2, 221-0, 221-1, 221-2, 222-0, 222-1, and 222-2 is provided to memory banks of the memory dies 208-1, 208-2, and 208-3 in a staggered, or asynchronous, manner.

Figure 3:
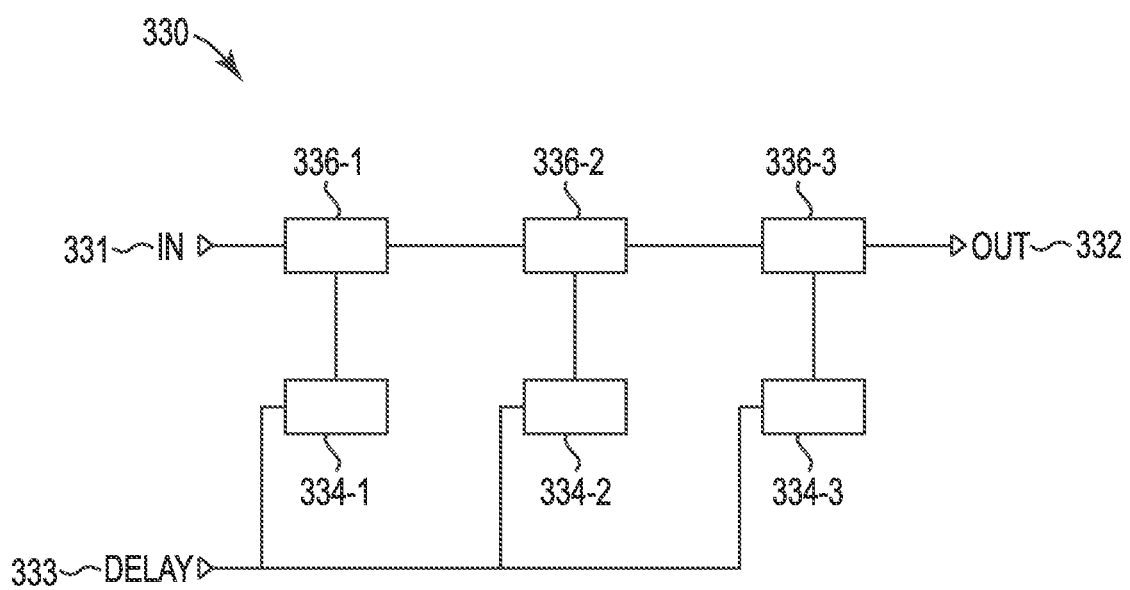
FIG. 3 illustrates an example of a refresh path in accordance with a number of embodiments of the present disclosure.

FIG. 3 illustrates an example of a refresh path 330 in accordance with a number of embodiments of the present disclosure. The refresh path 330 includes an input 331 and an output 332. The input and output can be on any portion of a refresh path of a memory die (e.g., the memory die 108-1 described in association with FIG. 1). Between the input and output are three delay blocks 336-1, 336-2, and 336-3 (referred to collectively as the delay blocks 336). The refresh path 330 also includes a delay trim input 333. The delay trim input 333 represents the latched fuse states, which are used to select an amount of delay in the refresh path 330. The delay trim input 333 can select or activate any combination of the delay blocks 336 via selector blocks 334-1, 334-2, and 334-3. The delay trim input 333 is illustrated as being connected to three different delay selector blocks 334-1, 334-2, and 334-3, any combination of which can be selected with the delay trim input 333 to vary the total delay applied between the input 331 and the output 332. As illustrated, eight different individual delays are selectable with three different delay states 335. Embodiments are not limited to three delay states as other quantities of delay states are possible.

By way of example, the delay blocks 336 can represent inverters added in series to delay a signal, however embodiments are not limited to this example. The delay trim input 333 can activate the selector blocks 334, which can be multiplexed with the delay blocks 336 to effectively create an addressable or selectable variable delay path between the input 331 and the output 332.

Figure 4:
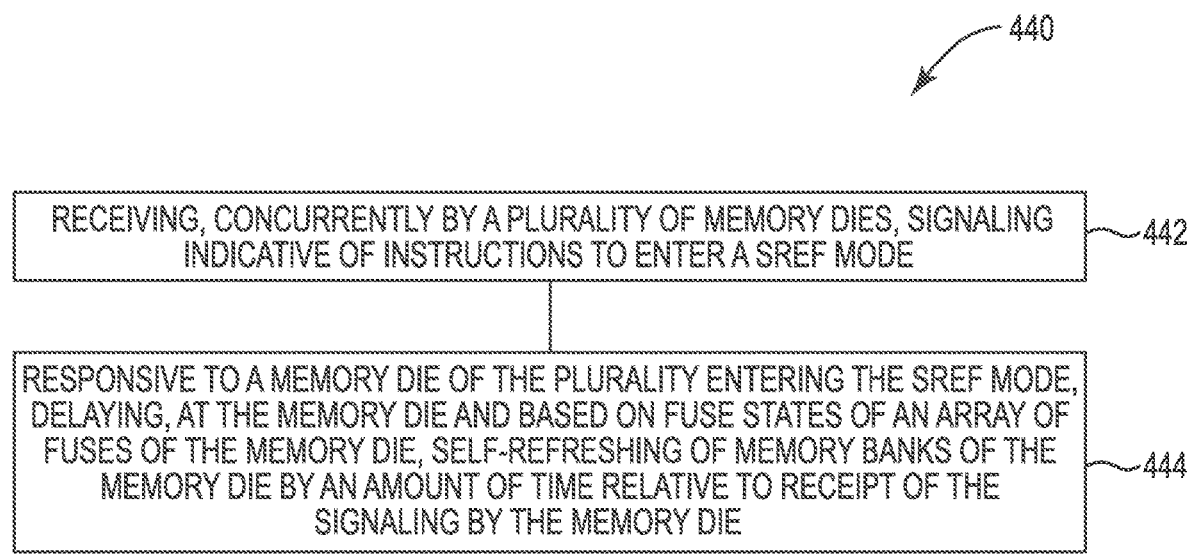
FIG. 4 illustrates an example flow diagram of a method for delaying, at a memory die, self-refreshing of memory banks of the memory die in accordance with a number of embodiments of the present disclosure.

FIG. 4 illustrates an example flow diagram of a method 440 for delaying, at a memory die, self-refreshing of memory banks of the memory die in accordance with a number of embodiments of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or combinations thereof. In some embodiments, the method 440 is performed by one or more memory dies 108 of a memory sub-system 104 described in association with FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 442, the method 440 can include receiving, concurrently by a plurality of memory dies, signaling indicative of instructions to enter a SREF mode.

At block 444, the method 440 can include in response to a memory die of the plurality of memory dies entering the SREF mode, delaying, at the memory die and based on fuse states of an array of fuses of the memory die, self-refreshing of memory banks of the memory die by at least an amount of time relative to receipt of the signaling by the memory die. Delaying the self-refresh of the memory banks of the memory die can include programming the array of fuses to cause propagation of signaling associated with the self-refreshing of the memory banks in at least the amount of time.

Although not specifically illustrated by FIG. 4, the method 440 can include, in response to a different memory die of the plurality of memory dies entering the SREF mode, delaying, at the different memory die and based on fuse states of a different array of fuses of the different memory die, self-refreshing of memory banks of the different memory die, relative to receipt of the signaling by the different memory die, by at least a different amount of time than the amount of time. The method 440 can include, in response to a different memory die of the plurality of memory dies entering the SREF mode, delaying, at the different memory die and a different array of the different memory die, self-refreshing of memory banks of the different memory die by a multiple of the amount of time.

In some embodiments, the method 440 can include performing a refresh operation after the amount of time relative to receipt of the signaling by the memory die. Self-refreshing of memory cells of the different memory die can be delayed, at the different memory die and using a different fuse array of the different memory die, by the amount of time relative to performing the refresh operation.

Figure 5:
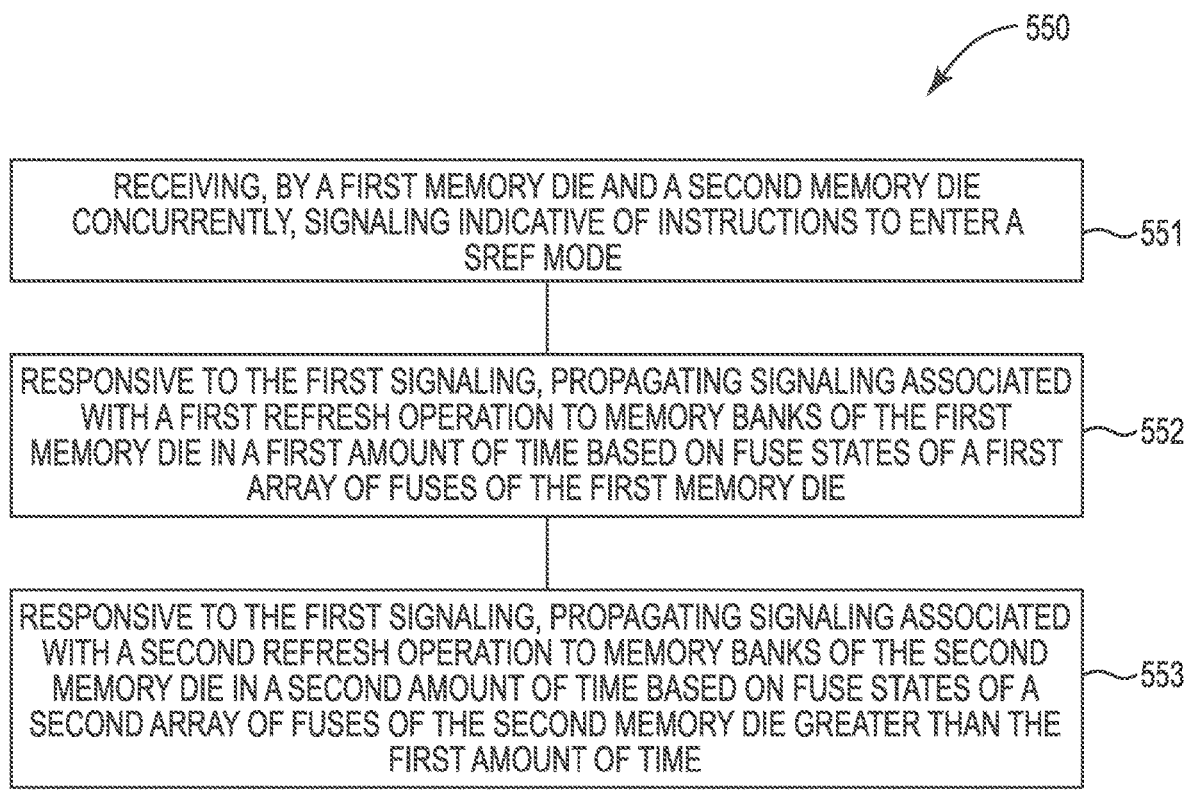
FIG. 5 illustrates an example flow diagram of a method for delaying, at a memory die, self-refreshing of memory banks of the memory die in accordance with a number of embodiments of the present disclosure.

FIG. 5 illustrates an example flow diagram of a method 550 for delaying, at a memory die, self-refreshing of memory banks of the memory die in accordance with a number of embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or combinations thereof. In some embodiments, the method 550 is performed by one or more memory dies 108 of a memory sub-system 104 described in association with FIG. 1. Although shown in a sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 551, the method 550 can include receiving, by a first memory die and a second memory die concurrently, signaling indicative of instructions to enter a SREF mode.

At block 552, the method 550 can include, in response to the signaling, propagating signaling associated with a first refresh operation to memory banks of the first memory die in a first amount of time based at least in part on fuse states of a first array of fuses of the first memory die. Propagating the signaling associated with the first refresh operation can be based on internal timing of the first memory die.

At block 553, the method 550 can include, in response to the signaling, propagating signaling associated with a second refresh operation to memory cells of the second memory die in a second amount of time based at least in part on fuse states of a second array of fuses of the second memory die. Propagating the signaling associated with the second refresh operation can be based on internal timing of the second memory die. The second amount of time can be greater than the first amount of time.

Figure 6:
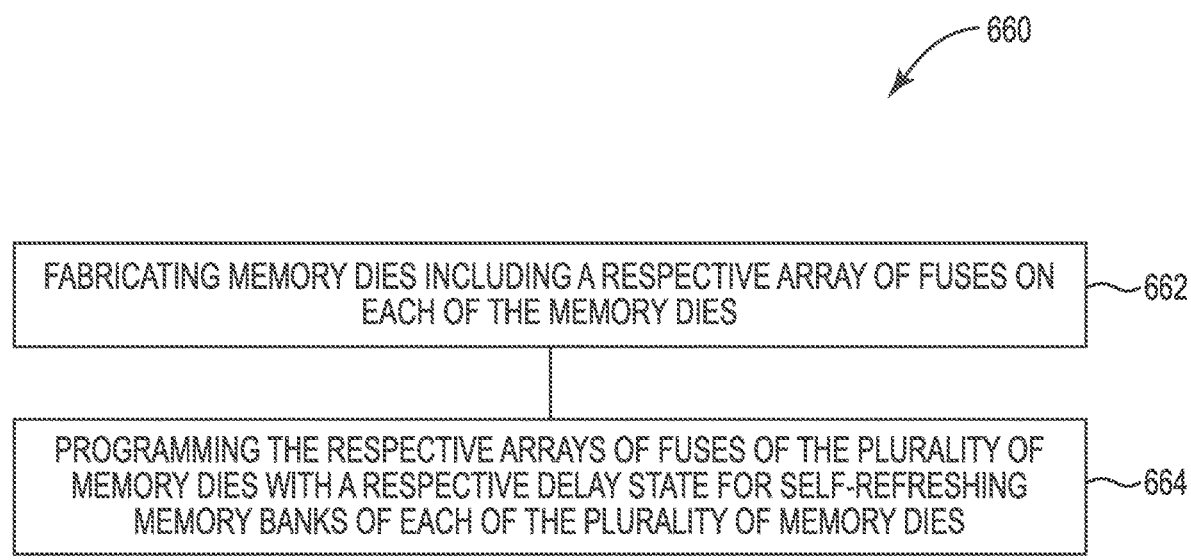
FIG. 6 illustrates an example flow diagram of a method for fabricating a memory device in accordance with a number of embodiments of the present disclosure.

FIG. 6 illustrates an example flow diagram of a method 660 for fabricating a memory device in accordance with a number of embodiments of the present disclosure. The method 660 can be performed by processing logic that can include hardware (e.g., processing device, circuitry, dedicated logic, programmable logic, microcode, hardware of a device, integrated circuit, etc.), software (e.g., instructions run or executed on a processing device), or combinations thereof. One or more processes can be omitted in various embodiments. Thus, not all processes are required in every embodiment. Other process flows are possible.

At block 662, the method 660 can include fabricating memory dies, each including a respective fuse array. The memory dies can be mass produced and then coupled into any number of memory packages as desired. The memory dies include memory banks. The fuse arrays can be fabricated generically (e.g., without specific programming) and later programmed with device-specific settings. The memory dies can be fabricated with latches configured to store settings that are programmed into the fuse arrays.

At block 664, the method 660 can include programming the fuse arrays with a respective delay state for self-refreshing memory banks of each of the plurality of memory dies. Programming a fuse array can include changing a conductive state of at least one element (e.g., fuse or anti-fuse) of the array. The fuse array can be programmed (e.g., by a manufacturer of the memory package, or by an intermediate party between the manufacturer and the end-user) prior to shipping the memory package. This allows the fuse arrays to be fabricated generically (at least with respect to programmed delay states) to facilitate efficient production. Subsequently, the delay states can be programmed into the fuse array as desired for any specific memory package or series of memory packages (such as a line of products). The fuse arrays can also store other operational settings for the dies.

Figure 7:
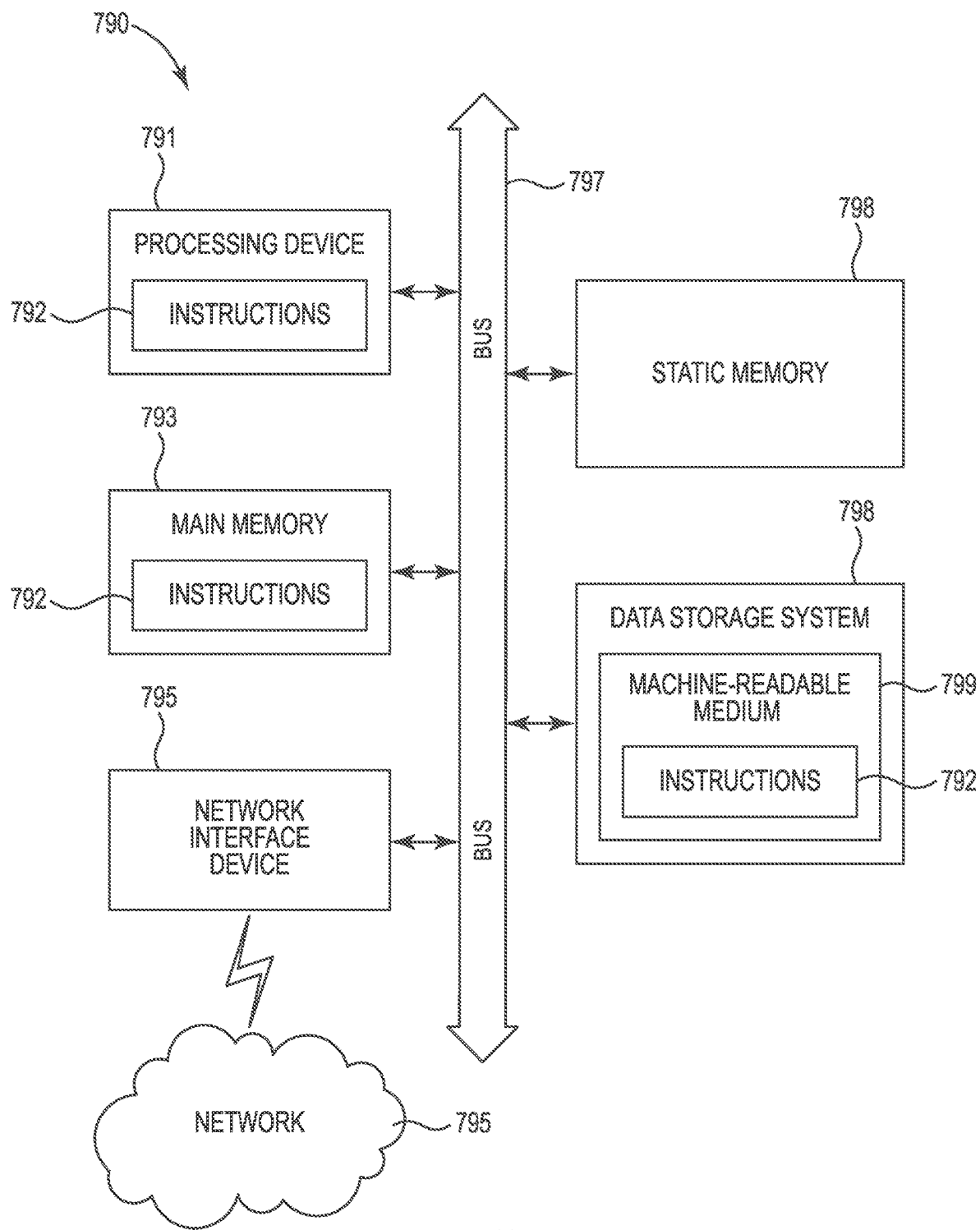
FIG. 7 illustrates an example computer system within which a set of instructions, for causing the machine to perform various methodologies discussed herein, can be executed.

FIG. 7 illustrates an example a computer system 790 within which a set of instructions, for causing the machine to perform various methodologies discussed herein, can be executed. In various embodiments, the computer system 790 can correspond to a system (e.g., the computing system 100 described in association with FIG. 1) that includes, is coupled to, or utilizes a memory sub-system (e.g., the memory sub-system 104). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 790 includes a processing device 791, a main memory 793 (e.g., read-only memory (ROM), flash memory, dynamic random access memory (DRAM) such as synchronous DRAM (SDRAM) or Rambus DRAM (RDRAM), etc.), a static memory 797 (e.g., flash memory, static random access memory (SRAM), etc.), and a data storage system 798, which communicate with each other via a bus 796.

The processing device 791 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 791 can also be one or more special-purpose processing devices such as an application specific integrated circuit (ASIC), a field programmable gate array (FPGA), a digital signal processor (DSP), network processor, or the like. The processing device 791 is configured to execute instructions 792 for performing the operations and steps discussed herein. The computer system 790 can further include a network interface device 794 to communicate over the network 795.

The data storage system 798 can include a machine-readable storage medium 799 (also known as a computer-readable medium) on which is stored one or more sets of instructions 792 or software embodying any one or more of the methodologies or functions described herein. The instructions 792 can also reside, completely or at least partially, within the main memory 793 and/or within the processing device 791 during execution thereof by the computer system 790, the main memory 793 and the processing device 791 also constituting machine-readable storage media.

In one embodiment, the instructions 792 include instructions to implement functionality corresponding to the memory dies 108 described in association with FIG. 1. While the machine-readable storage medium 799 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving, concurrently by a plurality of memory dies, first signaling indicative of instructions to enter a self-refresh (SREF) mode;
   responsive to a memory die of the plurality of memory dies entering the SREF mode, delaying, at the memory die and based at least in part on fuse states of an array of fuses of the memory die, self-refreshing of memory banks of the memory die by an amount of time relative to receipt of the first signaling by the memory die; and
   responsive to a different memory die of the plurality of memory dies entering the SREF mode, delaying, at the different memory die and based at least in part on fuse states of a different array of fuses of the different memory die, self-refreshing of memory banks of the different memory die by a multiple of the amount of time.

2. An apparatus, comprising:
   a plurality of memory dies coupled to a common command path via which first signaling indicative of instructions to enter a self-refresh (SREF) mode is provided to the plurality of memory dies concurrently, wherein each memory die comprises:
      an array of fuses configured to cause a delay of a respective amount of time in providing, to memory banks of the memory die, respective signaling indicative of a refresh operation in association with entering the SREF mode;
      a respective oscillator for timing of providing the respective signaling to the memory banks of the memory die; and
      a respective counter coupled to the respective oscillator,
   wherein each memory die is configured to provide the respective signaling to the memory banks of the memory die in response to the respective counter indicating a respective, different quantity of oscillations of the oscillator, and
   wherein the respective, different quantity of oscillations is based at least in part on fuse states of the array of fuses.

3. An apparatus, comprising:
   a plurality of memory dies, wherein each memory die comprises a respective array of fuses configured to cause propagation of signaling indicative of a refresh operation associated with self-refreshing the plurality of memory dies, via a respective refresh path of the memory die, to memory banks of the memory die in a respective amount of time,
   wherein fuse states of the respective array of fuses indicate a number of delay blocks to be coupled to the respective refresh path,
   wherein the number of delay blocks delay propagation of the signaling via the respective refresh path by at least a portion of the respective amount of time.

4. The apparatus of claim 3, wherein a first array of fuses of a first memory die of the plurality is configured to cause propagation of the signaling, via a first refresh path of the first memory die, to memory banks of the first memory die in a first amount of time, and
   wherein a second array of fuses of a second memory die of the plurality is configured to cause propagation of the signaling, via a second refresh path of the second memory die, to memory banks of the second memory die in a second amount of time that is different than the first amount time.

5. The apparatus of claim 3, further comprising a different plurality of memory dies,
   wherein the plurality of memory dies correspond to a first rank of a channel of a memory sub-system, and
   wherein the different plurality of memory dies correspond to a second rank of the channel of the memory sub-system.

6. The apparatus of claim 3, further comprising a different plurality of memory dies,
   wherein the plurality of memory dies correspond to a first channel of a memory sub-system, and
   wherein the different plurality of memory dies correspond to a second channel of the memory sub-system.

7. The apparatus of claim 3, wherein the apparatus comprises a dynamic random access memory (DRAM) module.

8. The apparatus of claim 7, wherein the plurality of memory dies comprise DRAM, and
   wherein the apparatus further comprises a different plurality of memory dies comprising a different type of memory than the plurality of memory dies.

9. A method, comprising:
   receiving, by a first memory die and a second memory die concurrently, first signaling indicative of instructions to enter a self-fresh (SREF) mode;
   responsive to the first signaling, propagating second signaling associated with a first refresh operation to memory banks of the first memory die in a first amount of time based at least in part on fuse states of a first array of fuses of the first memory die; and
   responsive to the first signaling, propagating third signaling associated with a second refresh operation to memory banks of the second memory die in a second amount of time based at least in part on fuse states of a second array of fuses of the second memory die, wherein the second amount of time is greater than the first amount of time.

10. The method of claim 9, wherein propagating the second signaling comprises propagating the second signaling based at least in part on internal timing of the first memory die, and
    wherein propagating the third signaling comprises propagating the third signaling based at least in part on internal timing of the second memory die.

11. A method, comprising:
    fabricating a memory package comprising a plurality of memory dies and a respective array of fuses on each of the plurality of memory dies; and
    programming, prior to shipping the memory package, the respective arrays of fuses of the plurality of memory dies with a respective delay state for self-refreshing memory banks of each of the plurality of memory dies.

12. The method of claim 11, wherein programming the respective arrays of fuses comprises changing a conductive state of at least one element of the respective arrays of fuses.

13. A method, comprising:
    receiving, concurrently by a plurality of memory dies, first signaling indicative of instructions to enter a self-refresh (SREF) mode;
    responsive to a memory die of the plurality of memory dies entering the SREF mode, delaying, at the memory die and based at least in part on fuse states of an array of fuses of the memory die, self-refreshing of memory banks of the memory die by an amount of time relative to receipt of the first signaling by the memory die;

providing, to the memory banks of the memory die, second signaling associated with a refresh operation associated with the SREF mode after the amount of time relative to receipt of the first signaling by the plurality of memory dies; and responsive to a different memory die of the plurality of memory dies entering the SREF mode, delaying, at the different memory die and based at least in part on fuse states of a different fuse array of the different memory die, self-refreshing of memory banks of the different memory die by the amount of time relative to providing the second signaling to the memory banks of the memory die.

14. The method of claim 13, further comprising programming the array of fuses so as to propagate the second signaling to the memory banks of the memory die in at least the amount of time.

15. An apparatus, comprising:
a plurality of memory dies coupled to a common command path via which first signaling indicative of instructions to enter a self-refresh (SREF) mode is provided to the plurality of memory dies concurrently, wherein each memory die comprises:
an array of fuses configured to cause a delay of a respective amount of time in providing, to memory banks of the memory die, respective signaling indicative of a refresh operation in association with entering the SREF mode
a respective oscillator for timing of providing the respective signaling to the memory banks of the memory die;
a first respective counter coupled to the respective oscillator; and
a second respective counter coupled to the respective oscillator and the first respective counter, wherein the second respective counter is configured to initiate counting oscillations of the respective oscillator in response to the first respective counter indicating a first respective quantity of oscillations of the respective oscillator, wherein each memory die is configured to provide the respective signaling in response to the second respective counter indicating a respective second quantity of oscillations of the respective oscillator directly subsequent to the first respective quantity of oscillations, and wherein the first respective quantity of oscillations and the second respective quantity of oscillations are based at least in part on fuse states of the array of fuses.

16. An apparatus, comprising:
a plurality of memory dies, wherein each memory die comprises a respective array of fuses configured to cause propagation of signaling indicative of a refresh operation associated with self-refreshing the plurality of memory dies, via a respective refresh path of the memory die, to memory banks of the memory die in a respective amount of time, wherein a first array of fuses of a first memory die of the plurality is configured to cause propagation of the signaling, via a first refresh path of the first memory die, to memory banks of the first memory die in a first amount of time, and wherein a second array of fuses of a second memory die of the plurality is configured to cause propagation of the signaling, via a second refresh path of the second memory die, to memory banks of the second memory die in a second amount of time that is different than the first amount time.

* * * * *